United States Patent [19]
Park et al.

[11] Patent Number: 6,119,335
[45] Date of Patent: Sep. 19, 2000

[54] METHOD FOR MANUFACTURING MULTI-LAYER PRINTED CIRCUIT BOARD

[75] Inventors: Keon Yang Park, Seoul; Byung Kook Sun, Taejeon-si; Jae Heun Joung, Cheongju-si; Dong Shin, Taejeon-si, all of Rep. of Korea

[73] Assignee: Samsung Electro-Mechanics Co., Ltd., Kyungki-Do, Rep. of Korea

[21] Appl. No.: 09/203,489

[22] Filed: Dec. 2, 1998

[30] Foreign Application Priority Data

Dec. 2, 1997 [KR] Rep. of Korea ............ 97-65362

[51] Int. Cl.⁷ ............................................. H05K 3/36
[52] U.S. Cl. .................................. 29/830; 29/852; 427/97
[58] Field of Search .................... 29/830, 852; 427/97

[56] References Cited

U.S. PATENT DOCUMENTS

| | | | |
|---|---|---|---|
| 4,933,045 | 6/1990 | DiStefano et al. | 29/852 |
| 5,232,548 | 8/1993 | Ehrenberg et al. | 29/852 |
| 5,258,094 | 11/1993 | Furui et al. | 29/852 |
| 5,263,243 | 11/1993 | Taneda et al. | 29/852 |
| 5,699,613 | 12/1997 | Chong et al. | 29/852 |

FOREIGN PATENT DOCUMENTS

| | | |
|---|---|---|
| 7-038218 | 2/1995 | Japan . |
| 8-279678 | 10/1996 | Japan . |
| 98-7902 | 3/1998 | Rep. of Korea . |

*Primary Examiner*—Carl J. Arbes
*Attorney, Agent, or Firm*—Lowe Hauptman Gopstein Gilman & Berner

[57] ABSTRACT

A method for manufacturing a build-up multi-layer printed circuit board for use in computers, VTR, or portable telephones is disclosed, in which the method of forming a hole in a circuit layer and the method of forming a hole in an insulating layer are made different from each other by applying a combined formation method, thereby improving the formation precision and efficiency in forming the holes. Specifically, a resin-clad copper foil (RCC) is stacked on a CCL (copper-clad laminate) after forming a printed circuit layer, and this structure is heated and pressed. Then, beams of an Nd-YAG laser are irradiated to remove the copper-clad layer, and then beams of $CO_2$ laser are irradiated to remove the residual resin insulator, thereby forming a via hole. Then, circuit patterns are formed on the board on which the via hole has been formed.

36 Claims, 12 Drawing Sheets

METHOD FOR MANUFACTURING MULTI-LAYER PRINTED CIRCUIT BOARD

BACKGROUND OF THE INVENTION

1. Field of the Invention

The present invention relates to a method for manufacturing a multi-layer printed circuit board. More specifically, the present invention relates to a build-up type multi-layer printed circuit board, in which the method of forming a hole in a circuit layer and the method of forming a hole in an insulating layer are made different from each other by applying a combined formation method, thereby improving the formation precision and efficiency in forming the holes.

2. Description of the Prior Art

The build-up type multi-layer printed circuit board can be manufactured in various ways. Generally, the method can be carried out in the following manner as shown in FIG. 1, wherein a printed circuit pattern 12 is formed by applying a photoetching process on both faces of a copper clad laminate (to be called 'CCL' below) 11 with copper films coated on both faces thereof. Thus an internal circuit is formed. On the CCL 11 with internal circuits formed thereon, there is stacked a resin-coated copper foil (to be called 'RCC' below) 13 with a resin film coated on one face thereof. Via holes 15 are formed in the structure, and then electroless plating is preformed. Thereafter, the plated board is subjected to the formation of a pattern 14 by applying a photoetching process, thereby forming an external circuit layer. Finally, photoresist is spread on the pattern.

The method for manufacturing the multi-layer printed circuit board using the RCC as described above is classified into two types based on the method of forming the via hole. One type is that in which the via hole is formed by a chemical etching method. Another is that in which the via hole is formed by laser beams. Recently, the laser beam method is more widely used.

In the conventional method for manufacturing the multi-layer printed circuit board by using laser beams, excimer lasers are mostly used. However, if the excimer laser is used, an image hole mask has to be used on the organic-film-coated copper foil so as to prevent the scattering of beams, this being a disadvantage. Particularly, if the FR-4 material is used instead of the organic film, the excimer laser cannot form the hole. Therefore, the selection of the insulating layer is limited, and the hole can be formed only down to a certain depth. Thus the freedom of formation is low, with the result that the density of the board is aggravated. In order to dissipate the disadvantages of the use of the excimer laser, the present inventors have invented a method for manufacturing a multi-layer printed circuit board by using a YAG laser (yttrium aluminum garnet laser), and have filed a patent application under Korean Patent Application Laid-open No. 98-7902.

As shown in FIG. 2a, this method is constituted as follows. That is, a printed circuit pattern 22 is formed on a CCL 21 by applying a photoetching process, and then, an RCC 23 is stacked on the patterned board. Then this structure is heated and pressed. Then the board with the RCC 23 stacked thereon is subjected to the formation of a via hole 25 by using a YAG laser. When an excimer laser is used, the excimer laser cannot drill the copper foil. Therefore, first the copper foil of the RCC is removed by an etching, and then, the via hole is drilled through the insulating layer. However, the YAG laser can drill a via hole even into the copper foil, and therefore, a pre-step of removing the copper foil is not required, this being an advantage. That is, if the YAG laser is used, a via hole 25 can be directly drilled into the insulating layer 23b without removing the copper foil 23a of the RCC 23. After the formation of the via hole by using the YAG laser, the board 20 is subjected to further process steps as shown in FIG. 2b. That is, in order to achieve an inter-layer connection, an electroless copper plating is carried out to plate the inside of the via hole 15. Then a Cu electroplating is carried out to form a plated layer 26, thereby making the inside of the via hole 25 conductive. Then finally, the usual exposure and development are carried out on the copper foil 3a of the RCC to form a circuit pattern, and then, a photoresist layer is formed, thereby completing the manufacturing process.

According to the above described Korean Patent Application Laid-open No. 98-7902, the via hole formation precision is improved, and the manufacturing process is simplified very much. However, the YAG laser is capable of drilling not only the copper foil 23a of the RCC 23 but also the insulating resin layer 23b. Therefore, as shown in FIG. 3a, damages may occur at an end point 22a of the pattern 22. In this case, even if an electroless plating is carried out, the inter-pattern connections become imperfect as shown in FIG. 3b. Further, in order to increase the density of the circuit board, in the case where the pattern 22 of the CCL 21 is made thin, or in the case where the insulating layer 23b of the RCC is made thin, if an intensity variation of the laser beams occurs, the pattern 22 of the CCL may be totally etched away as shown in FIG. 4a. In this case, as shown in FIG. 4b, a plated layer 26 is formed in a thickness of about 25 $\mu$m, and as shown in FIG. 4c, a photoresist layer of about 10 $\mu$m is formed. In this case, if the plated layer 26 is imperfect, the etching solution can attack the plated layer during an alkali etching to break the circuit connection at the portion A. Of course, the method using the YAG laser has advantages in that the formation precision of the via hole is improved, and that the manufacturing process becomes simple. In spite of these advantages, there are latent the reliability problems such as the circuit breaking or the like.

Further, when the via hole is drilled only by the YAG laser, if the via hole is to be densely formed, parts of the insulating resin layer 23b and the copper foil 23a are drilled based on a spiral step. Then a second step based on a Trepan step is carried out to remove the residual resin, and therefore, the drilling efficiency is aggravated. Besides, the insulating resin layer adheres on the copper foil layer, and the copper foil and the insulating resin layer are heterogenous each other. Therefore, the YAG laser is extremely inefficient in drilling the via hole. For example, when an Nd-YAG laser drills a via hole into a board with an RCC stacked thereon as shown in FIG. 2a, the drilling speed is barely 25 holes per second.

In an attempt to overcome these disadvantages, Japanese Patent Laid-open No. Hei-8-279678 proposes the following method. That is, only the copper foil is selectively removed, and the insulating layer is drilled by using a $CO_2$ laser. That is, as shown in FIGS. 5a to 5e, a copper foil 33a and a prepreg 33b which is made of a glass fiber are stacked on a CCL 31 with welding pads placed thereon. This structure is heated and pressed to harden the prepreg 33b. Then only the copper foil 33a corresponding to the welding pad is removed by etching, and then a via hole 35 is drilled into the hardened prepreg 33b by using a $CO_2$ laser. Then a conductive material is coated on the via hole 35.

This $CO_2$ laser method shows a high speed compared with the YAG laser method. However, the insulating layer is the prepreg composed of a glass fiber, and therefore, the control of the laser beams is difficult depending on the place where the glass fiber lies and the place where the glass fiber does not lie. That is, if the intensity of the laser beams of the $CO_2$ laser is made constant, the shapes of the via holes are not uniform, but the via hole may become convex like a bell as shown in FIG. 6a. Therefore, if an electroless plating is carried out on the via hole, the pad layer may be disconnected due to the thermal impact.

Another problem of this method is as follows. That is, the copper foil is removed by an etching, and therefore, the formation of a hole of less than 100 $\mu$m becomes difficult due to the inherent nature of etching. Not only that, but if a mismatch occurs in removing the copper foil, the shape of the via hole is deformed as shown in FIG. 6b, with the result that the reliability of the inter-layer connection is aggravated.

SUMMARY OF THE INVENTION

The present invention is intended to overcome the above described disadvantages of the conventional techniques.

Therefore it is an object of the present invention to provide a method for manufacturing a build-up type multi-layer printed circuit board, in which the formation of a hole in a circuit layer and the formation of a hole in an insulating layer are made different from each other by applying a combined formation method, thereby improving the formation precision and efficiency in forming the holes. The method of the present invention is suitable to manufacturing a high density printed circuit board.

In achieving the above object, the method for manufacturing a build-up type multi-layer printed circuit board according to the present invention includes the steps of: stacking an insulating layer upon a CCL (copper-clad laminate) with a circuit pattern formed thereon; and forming a circuit pattern again on the insulating layer, these steps being repeated, and the method specifically includes the steps of: stacking a resin-clad copper foil (RCC) on the CCL after forming a first printed circuit layer having a first circuit pattern, and heating and pressing this structure; forming a via hole in the RCC thus heated and pressed, for forming inter-layer connections; carrying out a plating on the board with a via hole formed therein, to form an electrically conducting layer for inter-layer electrical connections; forming a second printed circuit layer having a second circuit pattern on the board thus plated; and forming a protecting layer on the board after forming the second printed circuit layer, wherein the via hole for connecting the first circuit pattern of the first printed circuit layer to the second circuit pattern of the second printed circuit layer is formed by irradiating beams of an Nd-YAG laser to the relevant position to remove all copper foils of the RCC, and then, by irradiating beams of a $CO_2$ laser to the copper-foil-removed position to remove all of residual resin of RCC.

In another aspect of the present invention, the method for manufacturing a build-up type multi-layer printed circuit board according to the present invention includes the steps of: stacking an insulating layer upon a CCL with a circuit pattern formed thereon; and forming a circuit pattern again on the insulating layer, these steps being repeated, and the method specifically includes the steps of: stacking a resin-clad copper foil (RCC) on the CCL after forming a first printed circuit layer having a first circuit pattern, and heating and pressing this structure; forming a via hole in the RCC thus heated and pressed, for forming inter-layer connections; carrying out a plating on the board with a via hole formed therein, to form an electrically conducting layer for inter-layer electrical connections; forming a second printed circuit layer having a second circuit pattern on the board thus plated; stacking an RCC on the board again after forming the second printed circuit layer, heating and pressing the RCC, forming a plated layer on it, and forming a third printed circuit layer having a third circuit pattern; and forming a protecting layer on the board after forming the third printed circuit layer, wherein the via hole for connecting the first circuit pattern of the first printed circuit layer to the second circuit pattern of the second printed circuit layer is formed by irradiating beams of an Nd-YAG laser to the relevant position to remove all copper foils of the RCC, and then, by irradiating beams of a $CO_2$ laser to the copper-foil-removed position to remove all of residual resin of RCC; and the via hole for connecting the first circuit pattern of the first printed circuit layer to the third circuit pattern of the third printed circuit layer is formed by irradiating beams of an Nd-YAG laser to the relevant position to remove copper foils at least down to the second circuit pattern, and then, by irradiating beams of a $CO_2$ laser to the copper-foil-removed position to remove all of residual resin of the first circuit pattern.

In still another aspect of the present invention, the method for manufacturing a build-up type multi-layer printed circuit board according to the present invention includes the steps of: stacking an insulating layer upon a CCL with a circuit pattern formed thereon; and forming a circuit pattern again on the insulating layer, these steps being repeated, and the method specifically includes the steps of: stacking a resin-clad copper foil (RCC) on the CCL after forming a first printed circuit layer having a first circuit pattern, and heating and pressing this structure; forming a via hole in the RCC thus heated and pressed, for forming inter-layer connections; carrying out a plating on the board with a via hole formed therein, to form an electrically conducting layer for inter-layer electrical connections; forming a second printed circuit layer having a second circuit pattern on the board thus plated; stacking an RCC on the board again after forming the second printed circuit layer, heating and pressing the RCC, forming a plated layer on it, and forming a third printed circuit layer having a third circuit pattern; repeating procedures for forming respective printed circuit layers up to an nth printed circuit layer having an nth circuit pattern; and forming a protecting layer on the board after forming the nth printed circuit layer, wherein the via hole for connecting two or more circuit patterns is formed by irradiating beams of an Nd-YAG laser to the relevant position to remove from an uppermost printed circuit layer to a printed circuit layer disposed immediately above a lowermost printed circuit layer, and then, by irradiating beams of a $CO_2$ laser to the layer-removed position to remove all of residual resin of RCC of a lowermost printed circuit layer.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENT

In forming the via hole in the build-up type multi-layer printed circuit board according to the present invention, first the beams of a YAG laser are irradiated to drill the copper foil. Then the beams of a $CO_2$ laser are irradiated to drill the insulating layer. In this manner, the drilling precision is improved, and the drilling efficiency is promoted, as well as maintaining the quality reliability of the board.

Figure 1:
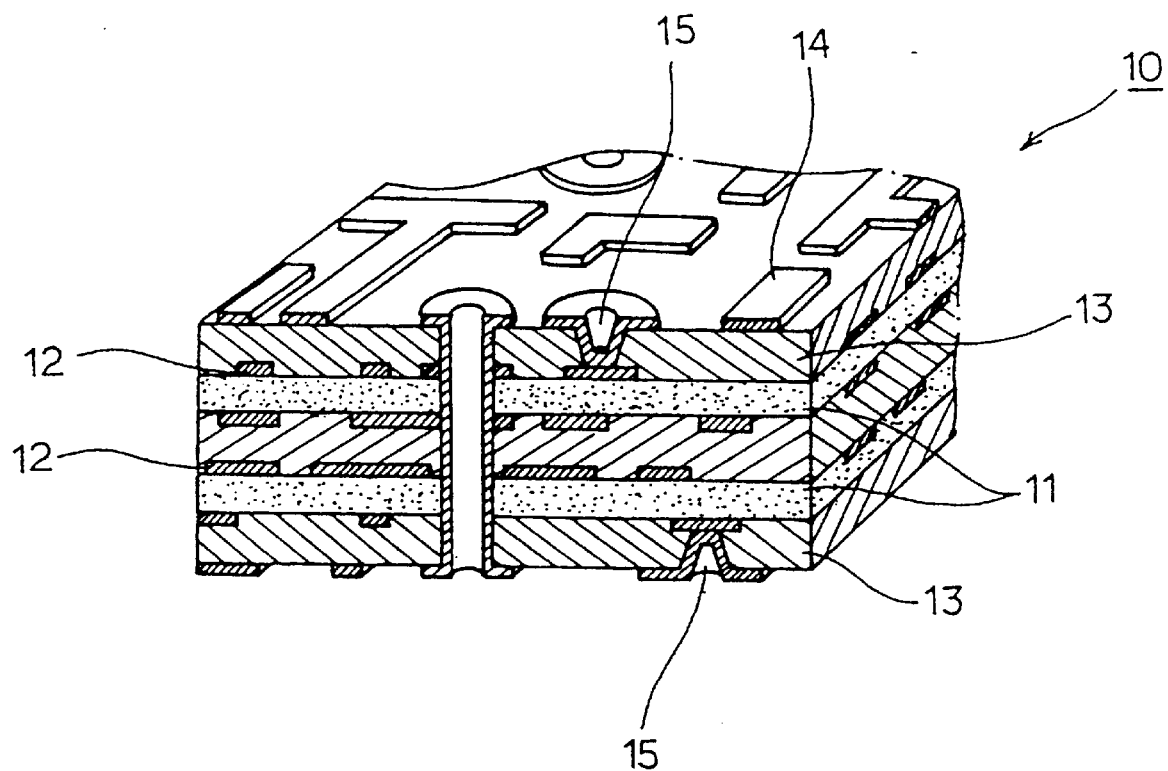
FIG. 1 is a perspective sectional view of the general multi-layer printed circuit board.
Figure 2A:
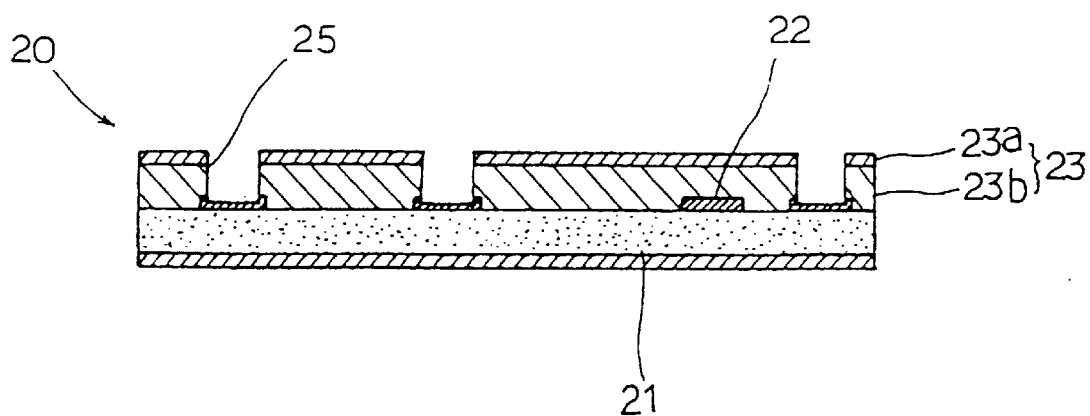
FIG. 2 illustrates the conventional method for manufacturing a multi-layer printed circuit board.
Figure 2B:
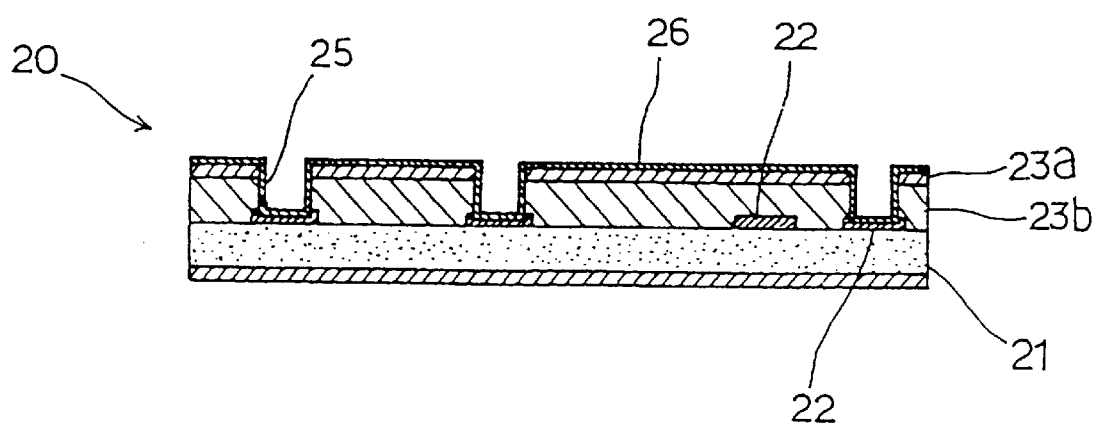
Figure 3A:
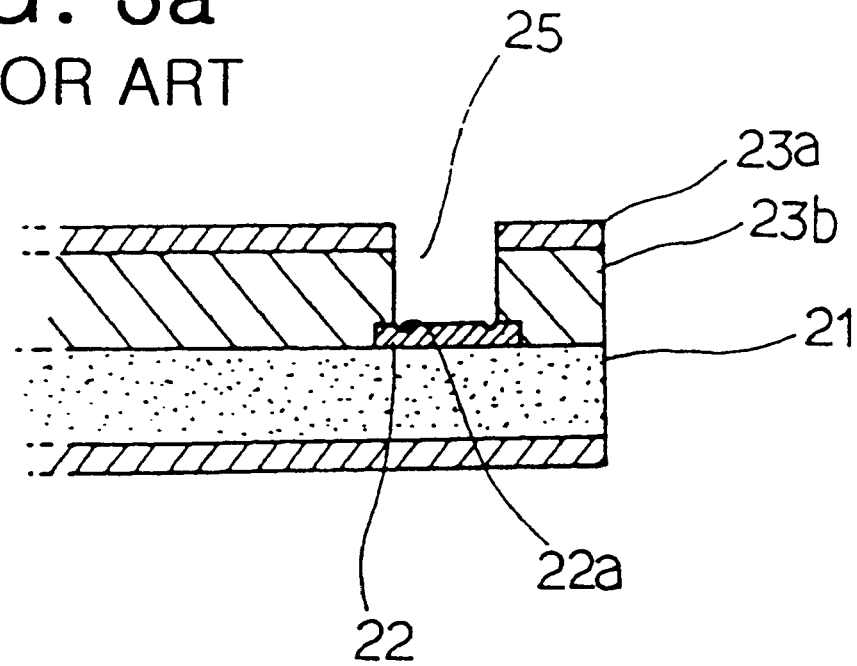
FIGS. 3a to 3b illustrate the manufacturing process of FIG. 2, in which a defective via hole is formed.
Figure 3B:
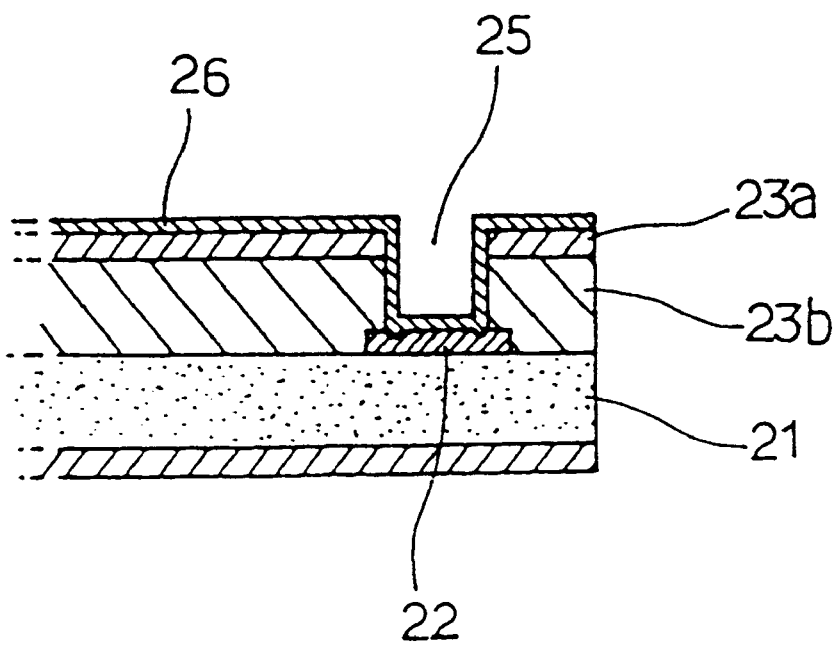
Figure 4A:
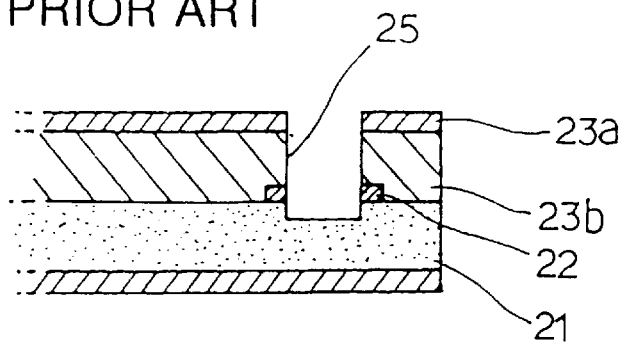
FIGS. 4a to 4c illustrates the manufacturing method of FIG. 2, in which another type of defective via hole is formed.
Figure 4B:
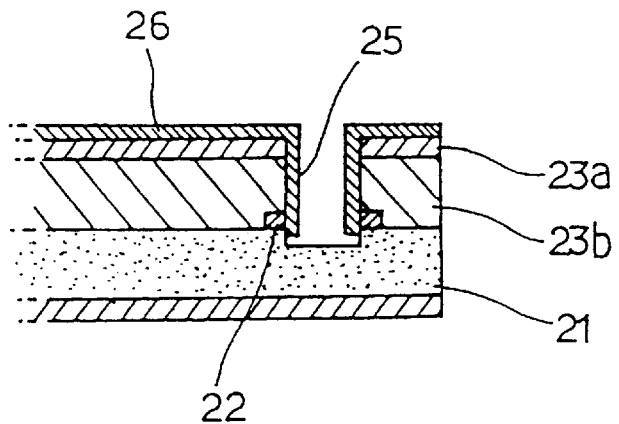
Figure 4C:
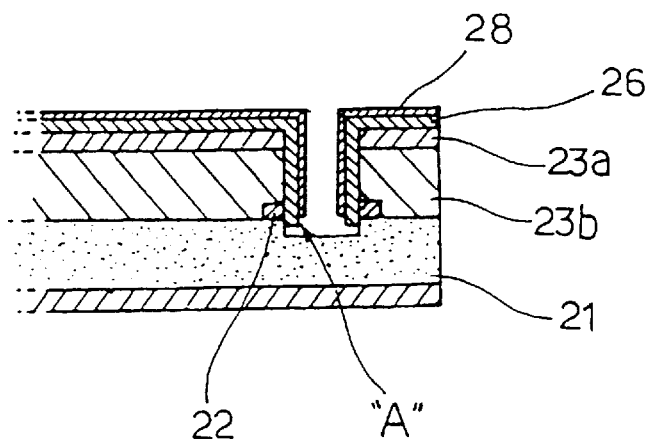
Figure 5A:
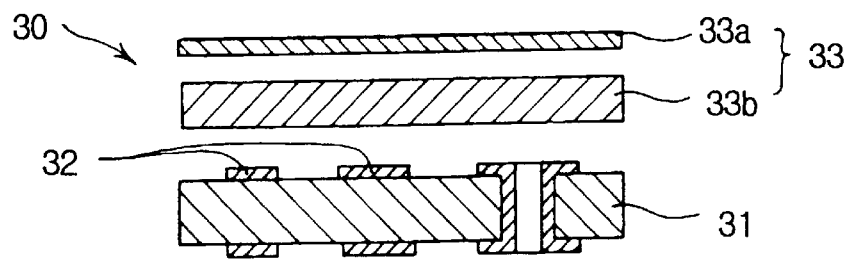
FIGS. 5a to 5e illustrates another conventional method for manufacturing a multi-layer printed circuit board.
Figure 5B:
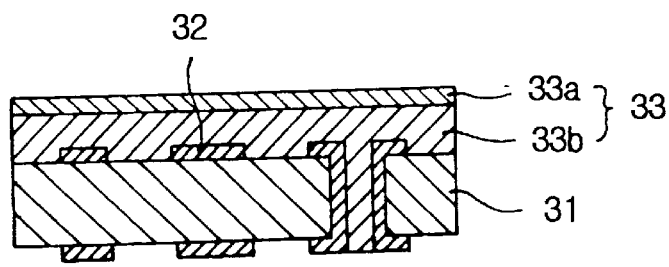
Figure 5C:
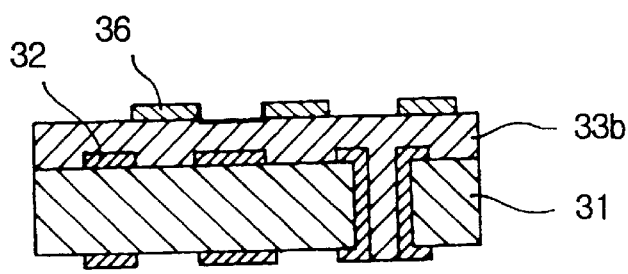
Figure 5D:
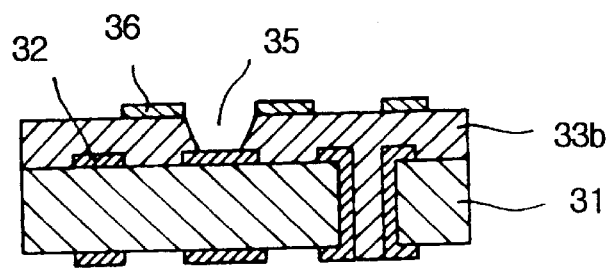
Figure 5E:
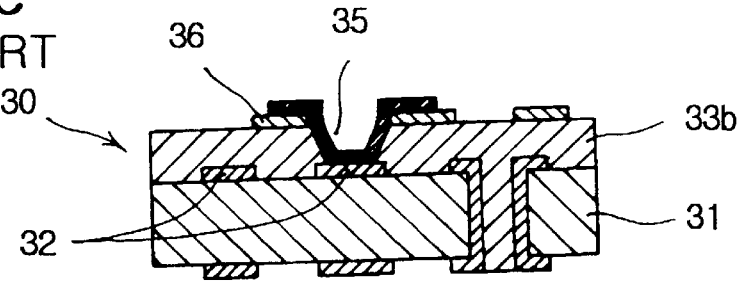
Figure 6A:
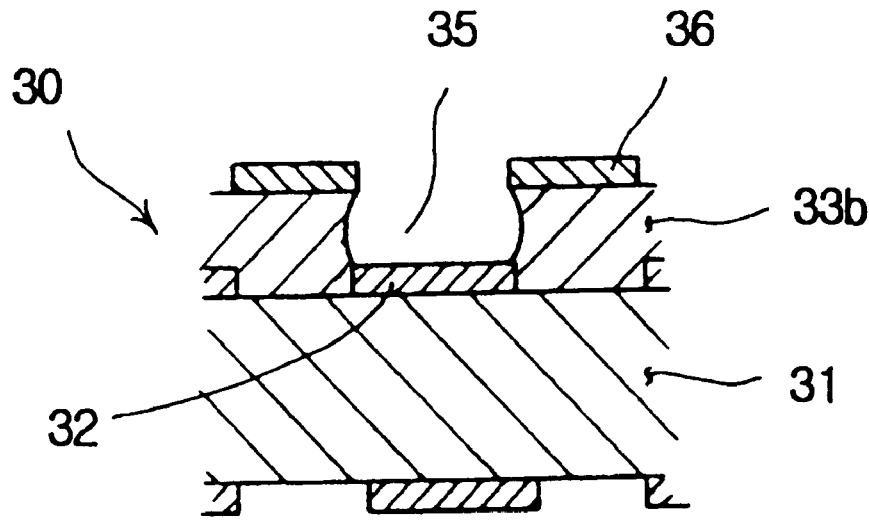
FIGS. 6a to 6b illustrate the manufacturing method of FIG. 5, in which a defective via hole is formed.
Figure 6B:
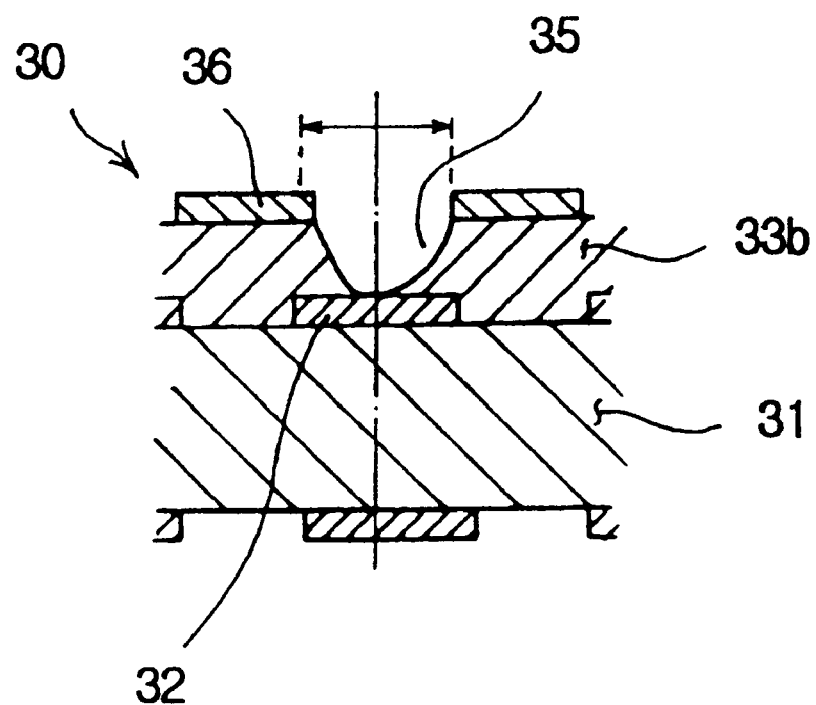
Figure 7A:
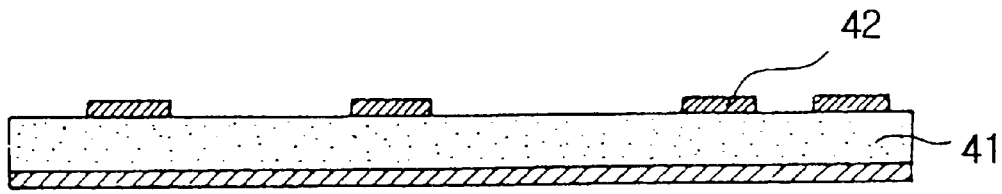
FIGS. 7a to 7f illustrate the method for manufacturing a 4-layer printed circuit board according to the present invention.
Figure 7B:
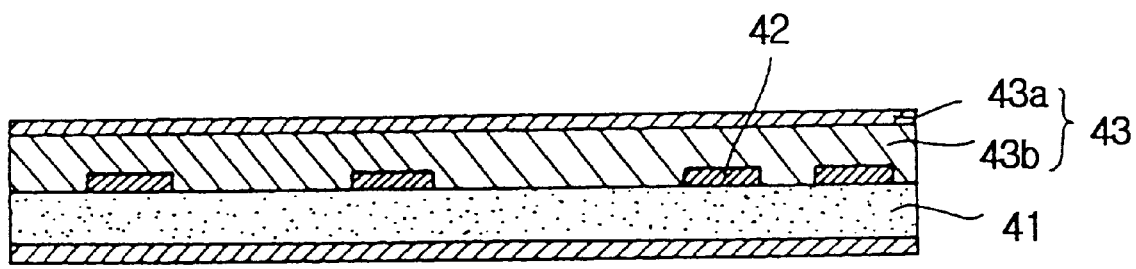

FIGS. 7a to 7f illustrates the process for manufacturing the multi-layer printed circuit board according to the present invention, and here, only one side is illustrated for the sake of describing convenience. First, referring to FIG. 7a, the usual photoetching process is carried out to form a first circuit pattern 42 on a CCL (copper-clad laminate) 41 on both faces of which copper foils have been stacked. Then as shown in FIG. 7b, an RCC (resin-clad copper foil) 43 with a resin attached on one face thereof is stacked on the CCL on which the first printed circuit layer has been formed. This is a pre-stacking, and this structure is heated and pressed. Under this condition, in order to improve the close contact between the RCC 43 and the CCL 41, the usual black oxide film treatment may be carried out.

The RCC 43 of the present invention should be preferably an epoxy resin-coated RCC. More preferably, the RCC 43 should be a resin-coated RCC having no glass fibers. Further, the transition temperature of a resin insulator 43b should be preferably 115° C. or above. Unlike the conventional prepreg, the RCC of the present invention is composed of a pure resin, and therefore, a uniform laser drilling is made possible. Accordingly, the precision of the via hole is improved. Particularly, the dielectric constant of the RCC is as low as 3.3, and therefore, the electrical reliability is ensured.

The thickness of the resin insulator can be variously adjusted depending on the kind of the board. In the case of the present invention, the thickness of the resin insulator should be preferably 200 μm or less.

In the present invention, a first stage of drilling is carried out by using the YAG laser 1 to remove down to a portion below a copper foil layer 43a of the RCC on the press-stacked board. Then the beams of the $CO_2$ laser 2 is irradiated to remove a resin insulator 43b, thereby forming a via hole 45 for inter-layer connections.

Figure 7C:
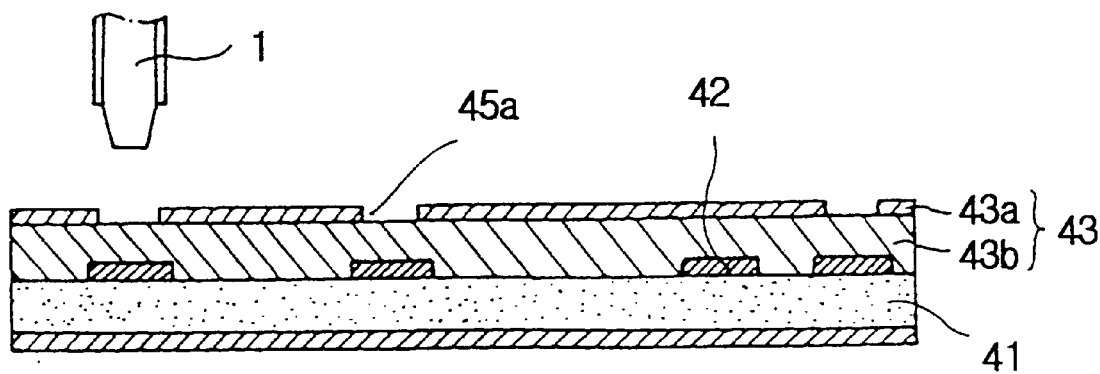

Specifically, as shown in FIG. 7c, first the YAG laser 1 is used to remove the copper foil layer 43a on the RCC. In this manner, the drilling efficiency is improved compared with the conventional method in which the copper foil layer and the resin insulator are simultaneously drilled. For example, if only the copper foil layer 43a of the RCC is drilled by means of the YAG laser, the drilling efficiency is improved up to 50 holes/sec.

In the drilling of the present invention, the Nd-YAG laser uses a power of 200–1300 mW, the pulse repetition rate of the Nd-YAG laser is 1–20 KHz, these being the proper ranges. The working conditions of the Nd-YAG laser are as follows. The bite size is 1~10 μm, the shift speed of the beams is 1~50 mm/sec, the number of passes is 1~10 passes, the effective spot size is 0–40 μm, the spiral inner diameter (the inside diameter upon forming an initial circuit) is 1–100 μm, the number of spiral turns is 1–10 rounds, and the spiral pitch is 40 μm or less.

Figure 7D:
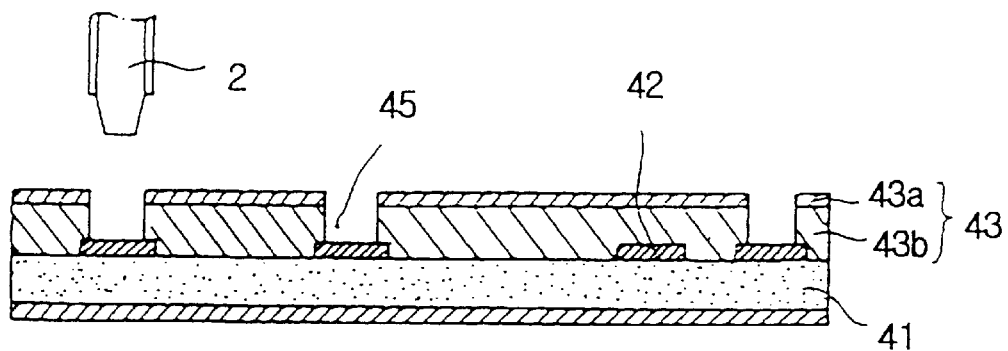

In this manner, the Nd-YAG laser is used to remove the copper foil layer as the first stage. Then as shown in FIG. 7d, the resin insulator 43b of the RCC on which the copper foil layer has been removed is drilled by means of the $CO_2$ laser 2, thereby forming a via hole 45 for inter-layer connections. In the case of the present invention, the $CO_2$ laser should preferably have the following conditions. That is, the pulse period should be 0.1–100 msec, the pulse width should be 1–100 μsec, the number of pulses should be 1–10, and the energy should be 0.7–2 mJ. In the method of the present invention, a tapered via hole can be formed, and the precision of the via hole can be improved. The present invention can be suitably applied to the formation of a via hole having a size of 25–200 μm.

When the $CO_2$ laser is used, a precise position setting is possible by using a criterium mark. Further, The drilling diameter of the $CO_2$ laser is larger than the drilling diameter of the YAG laser, and therefore, no mismatch occurs in forming the via hole. The $CO_2$ laser is capable of drilling the via holes at a speed of 400 holes/sec. Therefore, in the present invention in which the copper foil layer is first drilled and then the resin insulator is drilled, the hole drilling speed is greatly improved. Of course, when shifting from the YAG laser to the $CO_2$ laser, and owing to the difference in the drilling speeds, the drilling speed may be lowered. However, this problem can be solved in a simple manner by increasing the number of the YAG laser.

Most important of all, as can be seen in the examples presented later below, the first circuit pattern 42 of the CCL 41 is not hurt, and at the same time, the plating close contact is superior. Therefore, the reliability is ensured compared with the conventional methods.

Figure 7E:
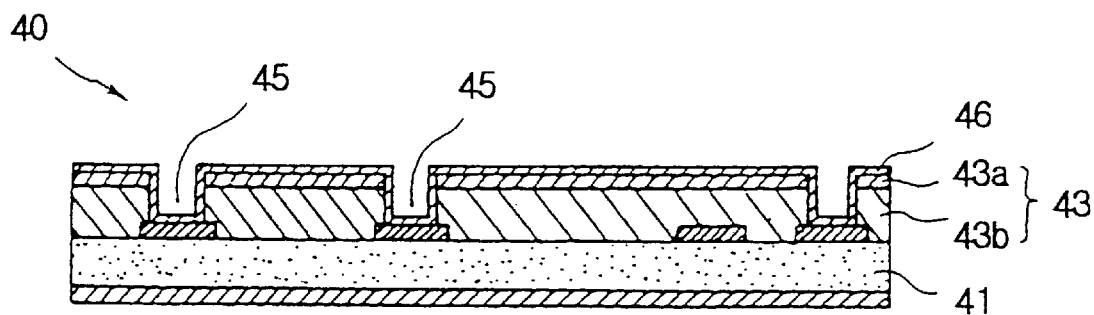

Then as shown in FIG. 7e, the board 40 on which the via hole 45 has been formed is made to undergo an electroless plating, and then, to undergo an electrolytic plating, thereby forming a plated layer 46.

Figure 7F:
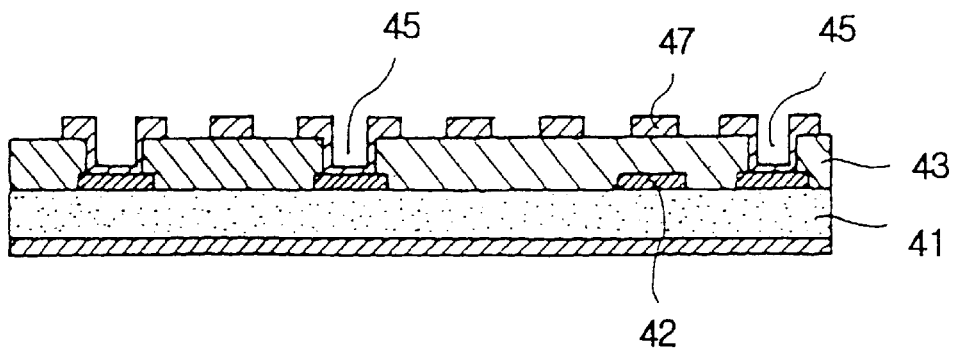

Then as shown in FIG. 7f, the board 40 with the plated layer 46 formed thereon is subjected to the formation of a second circuit pattern 47. In this manner, there is obtained a 4-layer printed circuit board having two printed circuit layers.

Meanwhile, if a plurality of RCC are stacked, there is obtained a multi-layer printed circuit board having 4 layers or more. That is, the RCC 43 is stacked again on one face of the board on which the plated layer has been formed. Then this structure is heated and pressed. This process is repeated to form the printed circuit layers as much as n times. In this manner, there is obtained a multi-layer printed circuit board having four layers or more.

FIGS. 8a to 8d illustrate the method for manufacturing a 6-layer printed circuit board according to the present invention. Unlike the conventional $CO_2$ laser method, when connecting the first circuit pattern of the first printed circuit layer to the third circuit pattern of the third printed circuit layer, an advantage is obtained. That is, in connecting non-adjacent patterns together, the method of the present invention is applied. That is, first the Nd-YAG laser is used to drill the copper foil layer as the first stage, and beams of the $CO_2$ laser are irradiated to the same spot to drill the resin insulator. Here, the advantage of the present invention is very great.

Figure 8A:
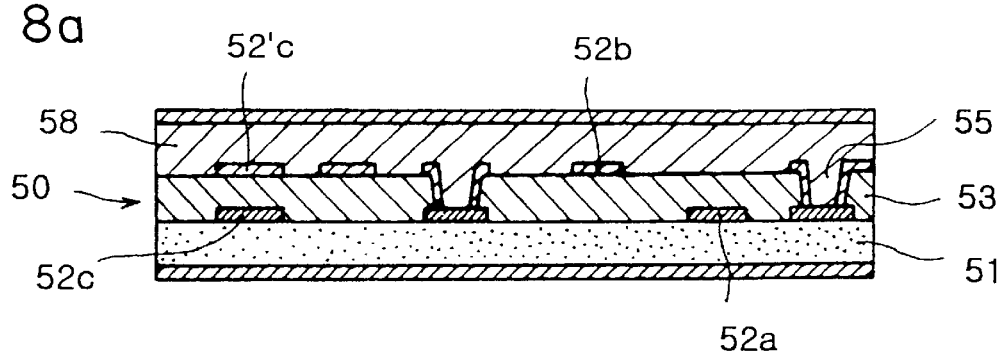
FIGS. 8a to 8d illustrate the method for manufacturing a 6-layer printed circuit board according to the present invention.
Figure 8B:
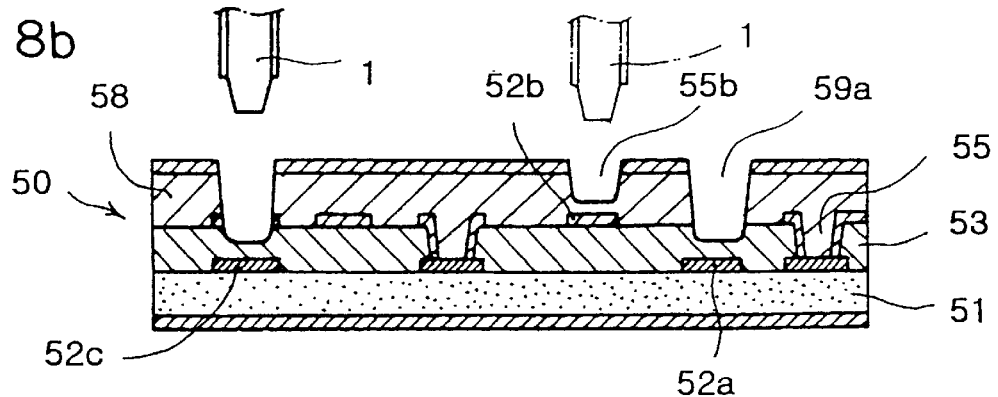
Figure 8C:
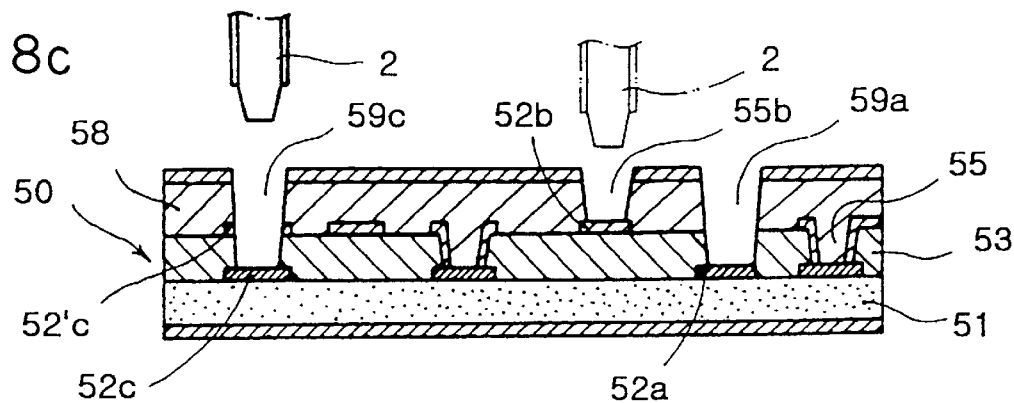

Specifically, when connecting non-adjacent layers together, first the via hole is drilled down to the fourth layer of FIG. 7. Then as shown in FIG. 8a, a new RCC 58 is stacked upon the RCC 53, and then, a heating and a pressing are carried out. Then as shown in FIG. 8b, the Nd-YAG laser 1 is irradiated so as to drill at least the copper foil. The via hole of FIG. 8b corresponds to a case of connecting a second circuit pattern 52b of the second printed circuit layer to a circuit pattern of the third printed circuit layer. A via hole 59a corresponds to a case of connecting a first circuit pattern 52a of the first printed circuit layer to a third circuit pattern of the third printed circuit layer. A via hole 59c corresponds to a case of connecting a first circuit pattern 52c of the first printed circuit layer not only to a second circuit pattern 52'c of the second printed circuit layer but also to a third circuit pattern 54 of the third printed circuit layer. In this manner, the via hole can be formed in various ways. The connection between the first and second circuit patterns of the first and second printed circuit layers is similar to that of FIG. 7. However, the connection between the first and third printed circuit layers and the connection between at least three layers of first-second-third layers are different. That is, first the YAG laser drills down to a portion of the resin insulator, and then, the $CO_2$ laser is irradiated as shown in FIG. 8c to remove the residual resin of the first circuit pattern.

In the present invention as shown in FIG. 8, the drilling is carried out in the following manner, if a via hole 55b for connecting the first and second printed circuit layers together is existent, and if a via hole for connecting the first and third printed circuit layers together or for connecting the first-second-third layers together is existent. That is, the YAG laser is used to drill the via hole 55b for connecting the first and second layers together, and to drill the via hole for connecting the first and third layers together or the first-second-third layers together, or to drill the vias hole in the opposite manner. That is, In the case where the YAG laser drills down to a portion of the via hole as a first stage, the drilling sequence is decided in accordance with the inter-layer thickness.

When drilling the via hole for connecting the first and third layers or for connecting the first-second-third layers together, the size of the via hole becomes larger than the case of drilling the via hole for connecting the first and second layers together. The working conditions of the YAG laser should be preferably such that the power is 750–1200 mW, the pulse repetition rate is 5.5–8.0 KHz, the bite size is 1.5–4.5 $\mu$m, the shifting speed of beams is 15–25 mm/sec, the number of passes is 2–4 passes, the correction value after drilling of the hole is 30–50 $\mu$m, the spiral inner diameter is 30–50 $\mu$m, the number of spiral turns is 2–5, and the spiral pitch is 15–40 $\mu$m.

After removing at least the copper foil layer by using the Nd-YAG laser as the first stage, beams of the $CO_2$ laser are irradiated to the same spot to drill the resin insulator of the RCC, thereby forming a via hole 59. In the present invention, the $CO_2$ laser which is suitable for drilling the resin insulator is operated at the working conditions of FIG. 7. Here, the via hole for connecting the first and third layers together or for connecting the first-second-third layers together is larger than the via hole for connecting the first and second layers together.

Figure 8D:
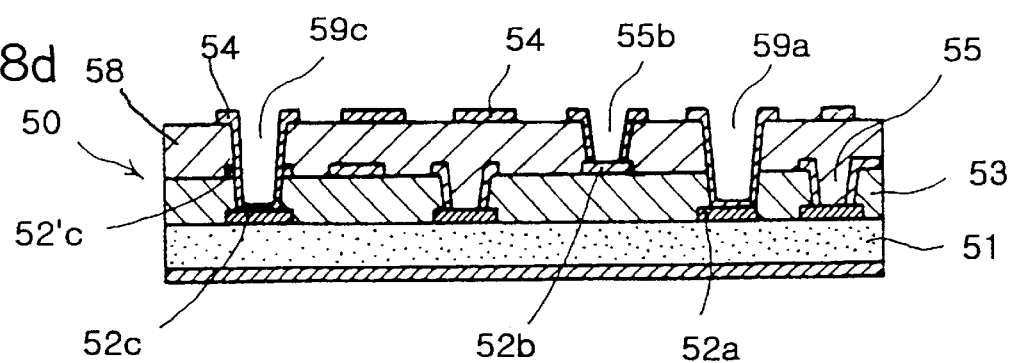

Then as shown in FIG. 8d, an electroless plating is carried out on the board 40 on which the via hole has been formed. Then an electrolytic plating is carried out on it to form a plated layer. Then a third circuit pattern 54 is formed by applying the usual photoetching process, thereby obtaining a 6-layer printed circuit board. In this manner, if a plurality of RCC are stacked to form circuit patterns as many as desired, then a multi-layer printed circuit board having 4 layers or more can be obtained.

Now the present invention will be described more specifically based on actual examples.

EXAMPLES

Inventive Example 1

The usual photoetching process was carried out on a CCL to form a printed circuit pattern on it, and a black oxide reduction treatment was carried out on the pattern. Then an RCC which had a transition temperature of 170° C. and a thickness of 40 $\mu$m was stacked on the black oxide treated CCL. Then the structure was heated and pressed with a pressure of 20–30 Kg/cm$^2$ at a temperature of 180° C. for 45 minutes. Thereafter, an Nd-YAG laser was irradiated to the relevant spot to drill a tapered via hole having a diameter of about 60 $\mu$m.

Here, the working conditions of the YAG laser were as follows. That is, the pulse repetition rate was 5.5 KHz, the bite size was 4.1 $\mu$m, the shifting speed of beams was 18.840 mm/sec, the number of passes was 1 pass, the correction value after the drilling was 34.00 $\mu$m, the spiral inner diameter was 24.0 $\mu$m, the number of spiral turns was 2 rounds, the pitch was 23.00 $\mu$m, the beam focus on the board was 0.4 mm, and the output power of the laser was 1150 mW.

After the drilling with the YAG laser, a $CO_2$ laser was used to drill the resin insulating layer. The working conditions of the $CO_2$ laser were such that the pulse period was 0.5 msec, the pulse width was 2–3 $\mu$sec, and the number of pulses was 3 rounds.

After the drilling of the via hole by using the YAG laser and the $CO_2$ laser, an electroless plating was carried out, and then, an electrolytic plating was carried out, thereby forming a plated layer having a thickness of 15 $\mu$m. An imagible dry film was spread on the board on which the plated layer has been formed. Then exposure, development, etching and dry film peeling process were carried out to form a circuit pattern. Then the above process was repeated to drill a via hole and to carry out an electroless copper pattern plating so as to form a copper plated layer of 25 $\mu$m. Then an Sn/Pb plating was carried out to a thickness of 10 $\mu$m to form an etching resist. Then the unnecessary copper foil was removed by applying a dry film peeling process and an etching process, and then, the Sn/Pb layer was peeled to form a circuit for connecting the outer and inner layers. For the board thus manufactured, its cross section was photographed, and this is shown in FIG. 9.

Figure 9:
FIG. 9 is a photograph showing the sectional structure of the via hole of the board which is formed according to the present invention.

As can be seen in FIG. 9, according to the present invention, the pattern of the CCL was not damaged, and the plated layer within the via holes was normally formed. Therefore, there will be no problem in the inter-layer conduction.

Conventional Example 1

A 4-layer printed circuit board was manufactured in a manner same as that of the above example, except that the via hole was drilled by using only the Nd-YAG laser. Here, the working conditions of the YAG laser were as follows. That is, the pulse repetition rate was 5.555 KHz, the bite size was 4.14 μm, the shifting speed of beams was 23.00 mm/sec, the number of passes was 1 pass, the correction value after the drilling was 30 μm, the spiral inner diameter was 35 μm, the number of spiral turns was 3 rounds, the pitch was 14.17 μm, and the power of the laser was 1180 mW. At above conditions, the drilling was carried out with the spiral method. Then a drilling was carried out by applying a trepan method at the following conditions. That is, the pulse repetition rate was 7.142 KHz, the bite size was 7.28 μm, the shifting speed of beams was 52.00 μm, the number of passes was 1 pass, and the correction value after the drilling was 75 μm.

Figure 10:
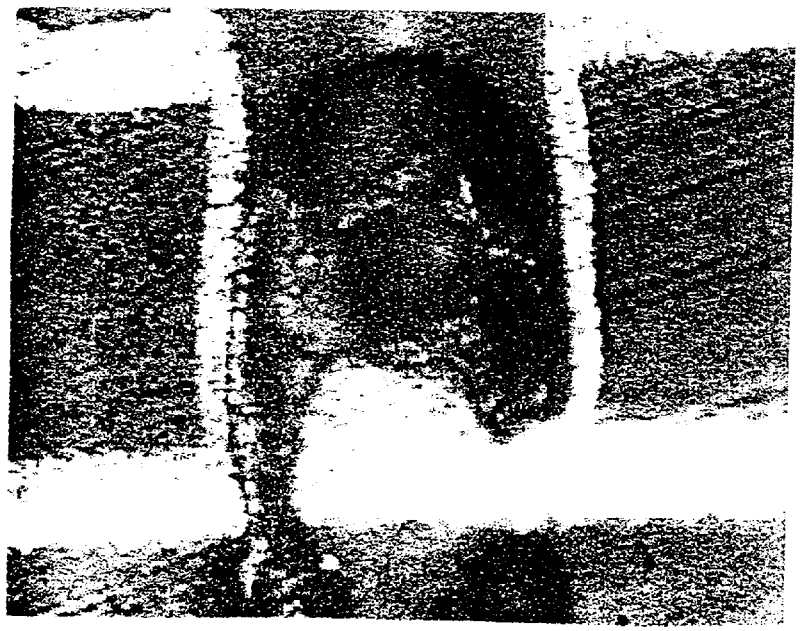
FIG. 10 is a photograph showing the sectional structure of the via hole which is formed by a conventional method.

Thus the via hole was drilled by means of the Nd-YAG laser through two stages, and the cross section of the board was photographed, this photograph being shown in FIG. 10.

As can be seen in FIG. 10, when the via hole was drilled by using only the Nd-YAG laser, the both edges of the CCL were damaged. Therefore, the reliability will be jeopardized.

Conventional Example 2

A prepreg composed of glass fibers was stacked on a CCL, and a copper foil was also stacked on it. Then the structure was heated and pressed to harden the prepreg. Then the relevant porion of the copper foil was removed by etching. Then a $CO_2$ laser was used to drill the hardened prepreg so as to form a via hole. Except the above matters, all other matters were same as those of Inventive example 1 in manufacturing a 4-layer printed circuit board.

Figure 11:
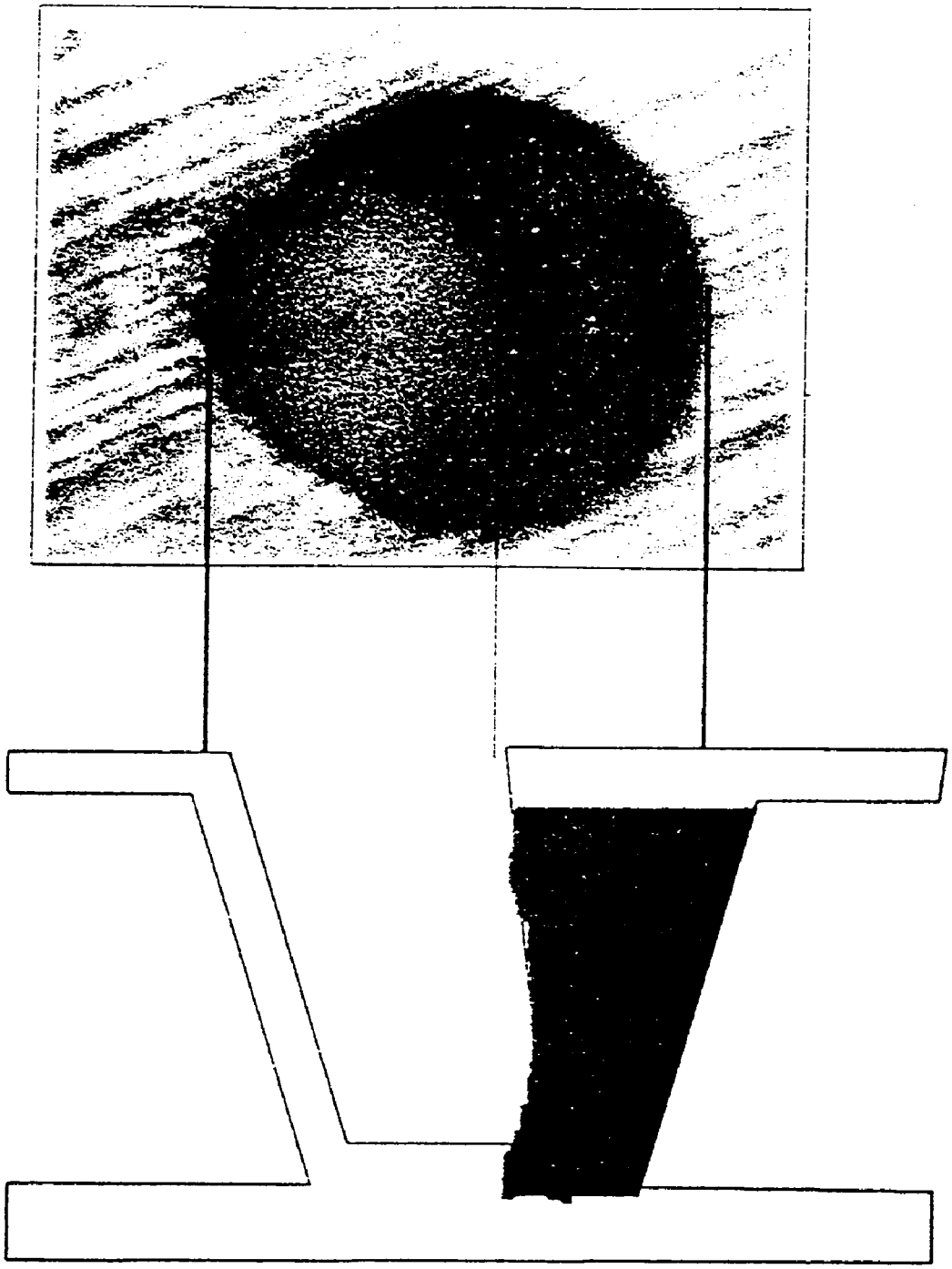
FIG. 11 is a photograph showing the sectional structure of the via hole which is formed by another conventional method.

For the printed circuit board thus manufactured by using the $CO_2$ laser, the cross section was photographed, and the photograph is shown in FIG. 11.

As can be seen in FIG. 11, in the case where the via hole was drilled by using the $CO_2$ laser, a mismatch of the copper foil occurred during the etching, and therefore, after the irradiation of the laser beams, the via hole was considerably biased, with the result that the reliability is aggravated.

Inventive Example 2

A 6-layer printed circuit board was manufactured in a manner same as that of Inventive example 1, except that two RCC layers were stacked on a substrate, this structure was heated and pressed, and beams of an Nd-YAG laser were irradiated to form a via hole for connecting first-second-third layers together. Here, the working conditions of the YAG laser were as follows. That is, the pulse repetition rate was 6.666 KHz, the bite size was 3.38 μm, the shifting speed of beams was 22.50 mm/sec, the number of passes was 2 passes, the correction value after the drilling was 40.00 μm, the spiral inner diameter was 38 μm, the number of spiral turns was 4 rounds, the pitch was 18.38 μm, and the output power of the laser was 1180 mW.

Then beams of a $CO_2$ laser were irradiated to the already drilled spot to drill the resin insulator. The working conditions of the $CO_2$ laser were such that the pulse period was 0.5 msec, the pulse width was 2–3 μsec, and the number of pulses was 3 rounds.

Figure 12:
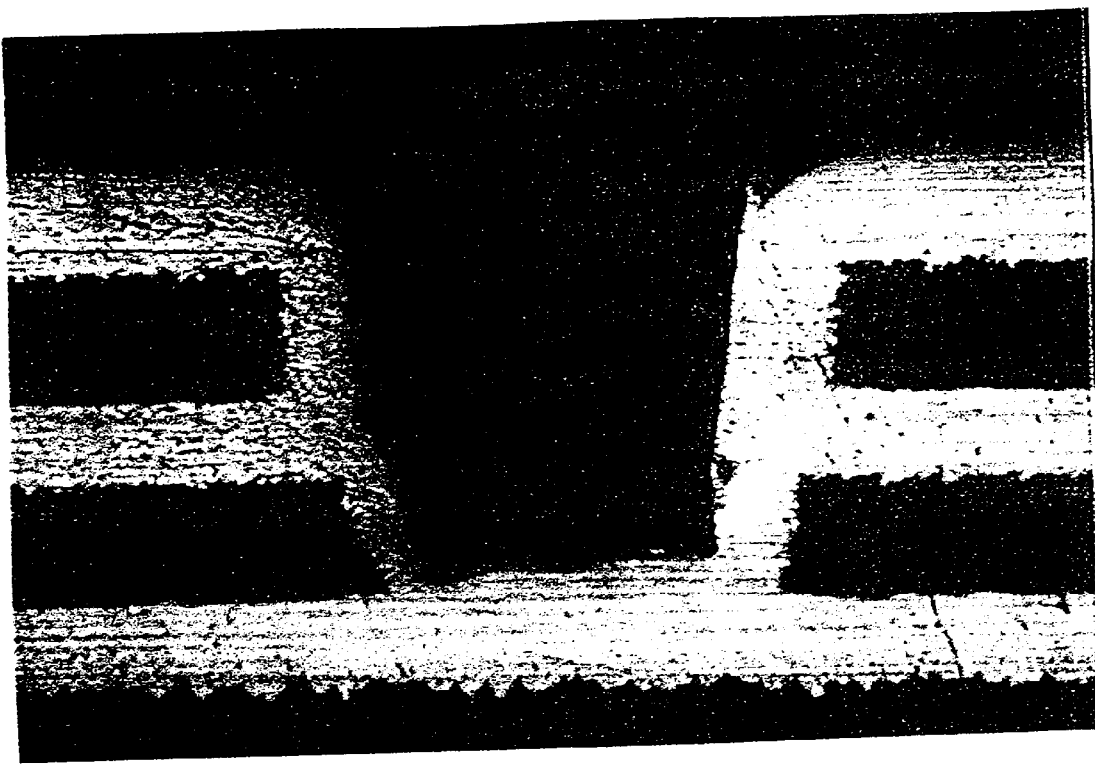
FIG. 12 is a photograph showing the sectional structure of the via hole of another board which is formed according to the present invention.

For the board thus manufactured, its cross section was photographed, and this is shown in FIG. 12. As shown in the drawing, the via hole was a tapered hole having a diameter of about 200 μm. As can be seen in FIG. 12, the pattern of the CCL was not damaged, and the plated layer within the via holes was normally formed. Therefore, there will be no problem in the inter-layer conduction.

According to the present invention as described above, the via hole of the printed circuit board is formed in a different manner, that is, by applying a combined method. As a result, the precision of the via hole is improved to upgrade the reliability of the circuit board. Further, the hole drilling efficiency is improved, and particularly, through the procedure of the exposure and etching, the process steps are simplified, while the method of the present invention prevents the contamination of the environment.

What is claimed is:

1. A method for manufacturing a build-up type multi-layer printed circuit board, with a insulating layer being stacked upon a copper clad laminate CCL with a circuit pattern formed thereon the method comprising the steps of:
    stacking a resin-clad copper foil (RCC) on said CCL after forming a first printed circuit layer having a first circuit pattern, and heating and pressing this structure;
    forming a via hole in said RCC thus heated and pressed, for forming inter-layer connections;
    carrying out a plating on said board with a via hole formed therein, to form an electrically conducting layer for inter-layer electrical connections;
    forming a second printed circuit layer having a second circuit pattern on said board thus plated; and
    forming a protecting layer on said board after forming said second printed circuit layer,
    wherein said via hole for connecting said first circuit pattern of said first printed circuit layer to said second circuit pattern of said second printed circuit layer is formed by irradiating beams of an Nd-YAG laser at a predetermined position to remove all copper foil of said RCC, and then, irradiating beams of a $CO_2$ laser to a copper-foil-removed position to remove all residual resin of said RCC.

2. The method as claimed in claim 1, wherein said resin-coated copper foil (RCC) is an epoxy resin-coated copper foil.

3. The method as claimed in claim 1, wherein a resin insulator coated on said RCC has a transition temperature (Tg) of 115° C.

4. The method as claimed in claim 1, wherein said resin insulator has a total thickness of 200 μm or less.

5. The method as claimed in claim 1, wherein said Nd-YAG laser has working conditions of: an output power of 200–1300 mW, and a pulse repetition rate of 1–20 KHz.

6. The method as claimed in claim 5, wherein said Nd-YAG laser has working conditions of: a bite size of 1~10 μm, a shift speed of the beams of 1~50 mm/sec, the number of passes of 1~10 passes, an effective spot size of 0–40 μm, a spiral inner diameter (inside diameter upon forming an initial circuit) of 1–100 μm, the number of spiral turns of 1–10 rounds, and a spiral pitch of 40 μm or less.

7. The method as claimed in claim 1, wherein said $CO_2$ laser has working conditions of: a pulse period of 0.1–100 msec, a pulse width of 1–100 μsec, the number of pulses of 1–10 rounds, and an energy of 0.7–2 mJ.

8. The method as claimed in claim 1, wherein said via hole has a diameter of 25–200 μm.

9. A method for manufacturing a build-up type multi-layer printed circuit board, with an insulating layer being stacked upon a CCL (copper clad laminate) with a circuit pattern already formed thereon, and a circuit pattern being formed again on said insulating layer, these being repeated, the method comprising the steps of:
stacking a resin-clad copper foil (RCC) on said CCL after forming a first printed circuit layer having a first circuit pattern, and heating and pressing this structure;
forming a via hole in said RCC thus heated and pressed, for forming inter-layer connections;
carrying out a plating on said board with a via hole formed therein, to form an electrically conducting layer for inter-layer electrical connections;
forming a second printed circuit layer having a second circuit pattern on said board thus plated;
stacking another RCC on said board after forming said second printed circuit layer, heating and pressing said RCC, forming a plated layer on it, and forming a third printed circuit layer having a third circuit pattern; and
forming a protecting layer on said board after forming said third printed circuit layer,
wherein said via hole for connecting said first circuit pattern of said first printed circuit layer to said second circuit pattern of said second printed circuit layer is formed by irradiating beams of an Nd-YAG laser to a relevant position to remove all copper foil of said RCC, and then, by irradiating beams of a $CO_2$ laser to a copper-foil-removed position to remove all of residual resin of RCC; and
wherein said via hole for connecting said first circuit pattern of said first printed circuit layer to said third circuit pattern of said third printed circuit layer is formed by irradiating beams of an Nd-YAG laser to a relevant position to remove copper foil at least down to said second circuit pattern, and then, by irradiating beams of a $CO_2$ laser to a copper-foil-removed position to remove all of residual resin of said first circuit pattern.

10. The method as claimed in claim 9, wherein said resin-coated copper foil (RCC) is an epoxy resin-coated copper foil.

11. The method as claimed in claim 9, wherein a resin insulator coated on said RCC has a transition temperature (Tg) of 115° C.

12. The method as claimed in claim 9, wherein said resin insulator has a total thickness of 200 μm or less.

13. The method as claimed in claim 9, wherein said Nd-YAG laser for forming a via hole for connecting a first circuit pattern of a first printed circuit layer to a second circuit pattern of a second printed circuit layer has working conditions of: an output power of 200–1300 mW, and a pulse repetition rate of 1–20 KHz.

14. The method as claimed in claim 13, wherein said Nd-YAG laser has working conditions of: a bite size of 1~10 μm, a shift speed of the beams of 1~50 mm/sec, the number of passes of 1~10 passes, an effective spot size of 0–40 μm, a spiral inner diameter (inside diameter upon forming an initial circuit) of 1–100 μm, the number of spiral turns of 1–10 rounds, and a spiral pitch of 40 μm or less.

15. The method as claimed in claim 9, wherein said $CO_2$ laser for forming a via hole for connecting said first circuit pattern of said first printed circuit layer to said second circuit pattern of said second printed circuit layer has working conditions of: a pulse period of 0.1–100 msec, a pulse width of 1–100 μsec, the number of pulses of 1–10 rounds, and an energy of 0.7–2 mJ.

16. The method as claimed in claim 9, wherein said via hole for connecting said first circuit pattern of said first printed circuit layer to said second circuit pattern of said second printed circuit layer has a diameter of 25–200 μm.

17. The method as claimed in claim 9, wherein said Nd-YAG laser for forming a via hole for connecting a first circuit pattern of a first printed circuit layer to a third circuit pattern of a third printed circuit layer has working conditions of: an output power of 750–1200 mW, and a pulse repetition rate of 5.5–8.0 KHz.

18. The method as claimed in claim 17, wherein said Nd-YAG laser has working conditions of: a bite size of 1.5~4.5 μm, a shift speed of the beams of 15~24 mm/sec, the number of passes of 2~4 passes, an effective spot size of 30–50 μm, a spiral inner diameter (inside diameter upon forming an initial circuit) of 30–50 μm, the number of spiral turns of 2–5 rounds, and a spiral pitch of 15–40 μm.

19. The method as claimed in claim 9, wherein said $CO_2$ laser for forming a via hole for connecting said first circuit pattern of said first printed circuit layer to said third circuit pattern of said third printed circuit layer has working conditions of: a pulse period of 0.1–100 msec, a pulse width of 1–100 μsec, the number of pulses of 1–10 rounds, and an energy of 0.7–2 mJ.

20. The method as claimed in claim 9, wherein said via hole for connecting said first circuit pattern of said first printed circuit layer to said third circuit pattern of said third printed circuit layer has a diameter of 25–250 μm.

21. A method for manufacturing a build-up type multi-layer printed circuit board, with an insulating layer being stacked upon a CCL (copper clad laminate) with a circuit pattern already formed thereon, and a circuit pattern being formed again on said insulating layer, these being repeated, the method comprising the steps of:
stacking a resin-clad copper foil (RCC) on said CCL after forming a first printed circuit layer having a first circuit pattern, and heating and pressing this structure;
forming a via hole in said RCC thus heated and pressed, for forming inter-layer connections;
carrying out a plating on said board with a via hole formed therein, to form an electrically conducting layer for inter-layer electrical connections;
forming a second printed circuit layer having a second circuit pattern on said board thus plated;
stacking an RCC on said board again after forming said second printed circuit layer, heating and pressing said RCC, forming a plated layer on it, and forming a third printed circuit layer having a third circuit pattern;
repeating above procedures for forming respective printed circuit layers up to an nth printed circuit layer having an nth circuit pattern; and
forming a protecting layer on said board after forming said nth printed circuit layer,
wherein said via hole for connecting two or more circuit patterns is formed by irradiating beams of an Nd-YAG laser to a relevant position to remove from an uppermost printed circuit layer to a printed circuit layer disposed immediately above a lowermost printed circuit layer, and then, by irradiating beams of a $CO_2$ laser to a layer-removed position to remove all of residual resin of RCC of a lowermost printed circuit layer.

22. The method as claimed in claim 21, wherein said resin-coated copper foil (RCC) is an epoxy resin-coated copper foil.

23. The method as claimed in claim 21, wherein a resin insulator coated on said RCC has a transition temperature (Tg) of 115° C.

24. The method as claimed in claim 21, wherein said resin insulator has a total thickness of 200 µm or less.

25. The method as claimed in claim 21, wherein said via hole for inter-layer connections is formed between adjacent printed circuit layers, and said Nd-YAG laser for forming said via hole has working conditions of: an output power of 200–1300 mW, and a pulse repetition rate of 1–20 KHz.

26. The method as claimed in claim 25, wherein said Nd-YAG laser has working conditions of: a bite size of 1~10 µm, a shift speed of the beams of 1~50 mm/sec, the number of passes of 1~10 passes, an effective spot size of 0–40 µm, a spiral inner diameter (inside diameter upon forming an initial circuit) of 1–100 µm, the number of spiral turns of 1–10 rounds, and a spiral pitch of 40 µm or less.

27. The method as claimed in claim 21, wherein said via hole for inter-layer connections is formed between adjacent printed circuit layers, and said $CO_2$ laser for forming said via hole has working conditions of: a pulse period of 0.1–100 msec, a pulse width of 1–100 µsec, the number of pulses of 1–10 rounds, and an energy of 0.7–2 mJ.

28. The method as claimed in claim 21, wherein said via hole for inter-layer connections is formed between adjacent printed circuit layers, and said via hole has a diameter of 25–200 µm.

29. The method as claimed in claim 21, wherein said via hole for inter-layer connections is formed between non-adjacent printed circuit layers, and said Nd-YAG laser for forming said via hole has working conditions of: an output power of 750–1200 mW, and a pulse repetition rate of 5–8.0 KHz.

30. The method as claimed in claim 29, wherein said Nd-YAG laser has working conditions of: a bite size of 1.5~4.5 µm, a shift speed of the beams of 15~24 mm/sec, the number of passes of 2~4 passes, an effective spot size of 30–50 µm, a spiral inner diameter (inside diameter upon forming an initial circuit) of 30–50 µm, the number of spiral turns of 2–5 rounds, and a spiral pitch of 15–40 µm.

31. The method as claimed in claim 21, wherein said via hole for inter-layer connections is formed between non-adjacent printed circuit layers, and said $CO_2$ laser for forming said via hole has working conditions of: a pulse period of 0.1–100 msec, a pulse width of 1–100 µsec, the number of pulses of 1–10 rounds, and an energy of 0.7–2 mJ.

32. The method as claimed in claim 21, wherein said via hole for inter-layer connections is formed between non-adjacent printed circuit layers, and said via hole has a diameter of 25–250 µm.

33. The method as claimed in claim 21, wherein said via hole for inter-layer connections is formed to connect at least three printed circuit layers simultaneously, and said Nd-YAG laser for forming said via hole has working conditions of: an output power of 750–1200 mW, and a pulse repetition rate of 5–8.0 KHz.

34. The method as claimed in claim 33, wherein said Nd-YAG laser has working conditions of: a bite size of 1.5~4.5 µm, a shift speed of the beams of 15~24 mm/sec, the number of passes of 2~4 passes, an effective spot size of 30–50 µm, a spiral inner diameter (inside diameter upon forming an initial circuit) of 30–50 µm, the number of spiral turns of 2–5 rounds, and a spiral pitch of 15–40 µm.

35. The method as claimed in claim 21, wherein said via hole for inter-layer connections is formed to connect at least three adjacent printed circuit layers simultaneously, and said $CO_2$ laser for forming said via hole has working conditions of: a pulse period of 0.1–100 msec, a pulse width of 1–100 µsec, the number of pulses of 1–10 rounds, and an energy of 0.7–2 mJ.

36. The method as claimed in claim 33, wherein said via hole for inter-layer connections is formed between non-adjacent printed circuit layers, and said via hole has a diameter of 25–250 µm.

\* \* \* \* \*